(12) United States Patent
Tung et al.

(10) Patent No.: US 11,310,941 B2
(45) Date of Patent: Apr. 19, 2022

(54) ELECTRONIC DEVICE AND HEAT SINK

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 0 days.

(21) Appl. No.: 17/029,443

(22) Filed: Sep. 23, 2020

(65) Prior Publication Data
US 2022/0078940 A1 Mar. 10, 2022

(30) Foreign Application Priority Data
Sep. 8, 2020 (CN) .......................... 202010931634.4

(51) Int. Cl.
*H05K 7/20* (2006.01)
*G06F 1/20* (2006.01)

(52) U.S. Cl.
CPC ............. *H05K 7/2039* (2013.01); *G06F 1/20* (2013.01); *H05K 7/20327* (2013.01)

(58) Field of Classification Search
CPC ...... G06F 1/20; G06F 1/203; G06F 2200/201; H05K 7/20927; H05K 7/20154; H05K 7/209; H05K 7/20909; H05K 2201/066; H05K 1/0203; H05K 7/20327; F28D 2021/0029
See application file for complete search history.

(56) References Cited

U.S. PATENT DOCUMENTS

| | | | | |
|---|---|---|---|---|
| 2002/0097559 A1* | 7/2002 | Inoue | ................. | G06F 1/203 361/688 |
| 2005/0161201 A1* | 7/2005 | Shiang-Chich | ..... | H01L 23/4093 165/121 |
| 2005/0280128 A1* | 12/2005 | Mok | ................ | H01L 23/427 257/678 |
| 2005/0280162 A1* | 12/2005 | Mok | ................ | H01L 23/427 257/778 |
| 2006/0238979 A1* | 10/2006 | Liu | ................ | H01L 23/427 361/699 |
| 2012/0170222 A1* | 7/2012 | Dede | ................ | F28F 3/083 361/702 |
| 2017/0263533 A1* | 9/2017 | Koyama | ................ | H01L 25/072 |
| 2018/0042137 A1* | 2/2018 | Reeves | ................ | H01L 21/4878 |

* cited by examiner

*Primary Examiner* — Adam B Dravininkas
(74) *Attorney, Agent, or Firm* — Locke Lord LLP; Tim Tingkang Xia, Esq.

(57) ABSTRACT

The invention provides a heat sink. The heat sink is configured to be in thermal contact with a heat source. The heat sink includes a base portion, a plurality of fin portions, and a wall portion. The base portion includes a thermal contact surface and a rear surface. The thermal contact surface is configured to be in thermal contact with the heat source, and the rear surface faces away from the thermal contact surface. The fin portions protrude from the rear surface of the base portion. The wall portion protrudes from the rear surface of the base portion and surrounds the fin portions. In addition, the invention also provides an electronic assembly including the heat sink.

8 Claims, 4 Drawing Sheets

ELECTRONIC DEVICE AND HEAT SINK

CROSS-REFERENCE TO RELATED APPLICATIONS

This non-provisional application claims priority under 35 U.S.C. § 119(a) on Patent Application No(s). 202010931634.4 filed in China on Sep. 8, 2020, the entire contents of which are hereby incorporated by reference.

BACKGROUND OF THE INVENTION

Technical Field of the Invention

The invention relates to an electronic device and a heat sink, more particularly to an electronic device and a heat sink that incorporates liquid cooling.

Description of the Related Art

As technology advances, various electronic devices are widely used in daily life. In addition to pursuing high-performance and short response time, portability and miniaturization are also important features needed for portable electronic products, making them easy to carry around. The higher the clock frequency or clock rate of the processor, the greater the waste heat the processor generates. Thus, to improve heat dissipation, the demand for the quality of fans, thermal adhesive, and heat sinks is increasing. The thermal adhesive and heat sink are small in size but they have an insufficient heat dissipation effect. In most cases, one or more fans are adopted to achieve a sufficient heat dissipation effect.

In air cooling, the fan is used to generate airflow for dissipating waste heat. The specific heat capacity of air is low, so the fan, sometimes, needs to operate at high speed to be able to effectively cool the electronic device. However, more fan noise caused by the fan motor will be produced. On the other hand, in order to provide various cloud services, servers must contain a great number of processors and other heat-generating components for dealing with huge amount of data processing and transmission. This makes the server have a higher requirement for cooling. However, the internal space of a server is very limited for cooling air, thus some servers choose liquid cooling over traditional air cooling as a thermal solution for high-density systems.

One of the traditional liquid cooling systems is to drop coolant on heat-generating components so as to absorb and take the waste heat away, and the coolant is in a closed-loop so as to be repeatedly used for heat dissipation. Considering the cost of the coolant that is thermally conductive and dielectric, user would not inject enough amount of coolant to immerse all of the heat-generating components. As a result, the drops of coolant may only stay a short period of time on the heat-generating components not fully-immersed in the coolant, thereby affecting the heat dissipation effect on these components. Therefore, it is desired to improve the heat dissipation effect of the above type of liquid cooling system.

SUMMARY OF THE INVENTION

The invention provides an electronic device and a heat sink that can effectively use coolant to improve the heat dissipation effect.

One embodiment of the invention provides a heat sink. The heat sink is configured to be in thermal contact with a heat source. The heat sink includes a base portion, a plurality of fin portions, and a wall portion. The base portion includes a thermal contact surface and a rear surface. The thermal contact surface is configured to be in thermal contact with the heat source, and the rear surface faces away from the thermal contact surface. The fin portions protrude from the rear surface of the base portion. The wall portion protrudes from the rear surface of the base portion and surrounds the fin portions.

Another embodiment of the invention provides an electronic device. The electronic device includes a casing, an electronic assembly, a heat sink, and a cover. The casing includes an accommodation space. The electronic assembly is located in the accommodation space. The electronic assembly includes a circuit board and a heat source. The circuit board is mounted on the casing, and the heat source is mounted on the circuit board. The heat sink is located in the accommodation space and includes a base portion, a plurality of fin portions, and a wall portion. The base portion includes a thermal contact surface and a rear surface. The thermal contact surface is in thermal contact with the heat source, and the rear surface faces away from the thermal contact surface. The fin portions protrude from the rear surface of the base portion. The wall portion protrudes from the rear surface of the base portion and surrounds the fin portions. The cover includes a plurality of through holes. The through holes are configured for a passage of a coolant to drop on the heat sink.

According to the electronic device and the heat sink, the wall portion surrounds the fin portions, such that the wall portion can retain the coolant on the heat sink so as to increase the time of heat exchange between the coolant and the fin portions.

BRIEF DESCRIPTION OF THE DRAWINGS

The present invention will become more fully understood from the detailed description given hereinbelow and the accompanying drawings which are given by way of illustration only and thus are not limitative to the present invention and wherein.

DETAILED DESCRIPTION

Figure 1:
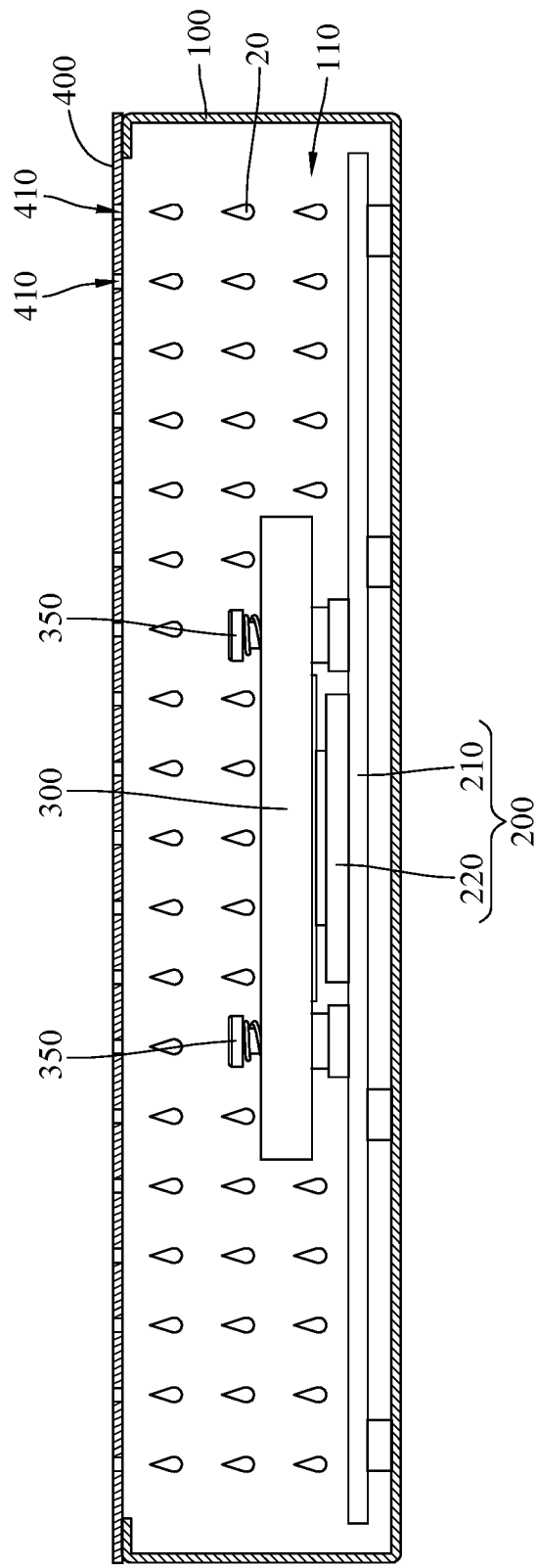
FIG. 1 is a perspective view of an electronic device according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present invention is not limited thereto. Furthermore, for the purpose of illustration, some of the structures and components in the figures are simplified, and wires, reference lines or buses are omitted in some of the figures.

Moreover, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
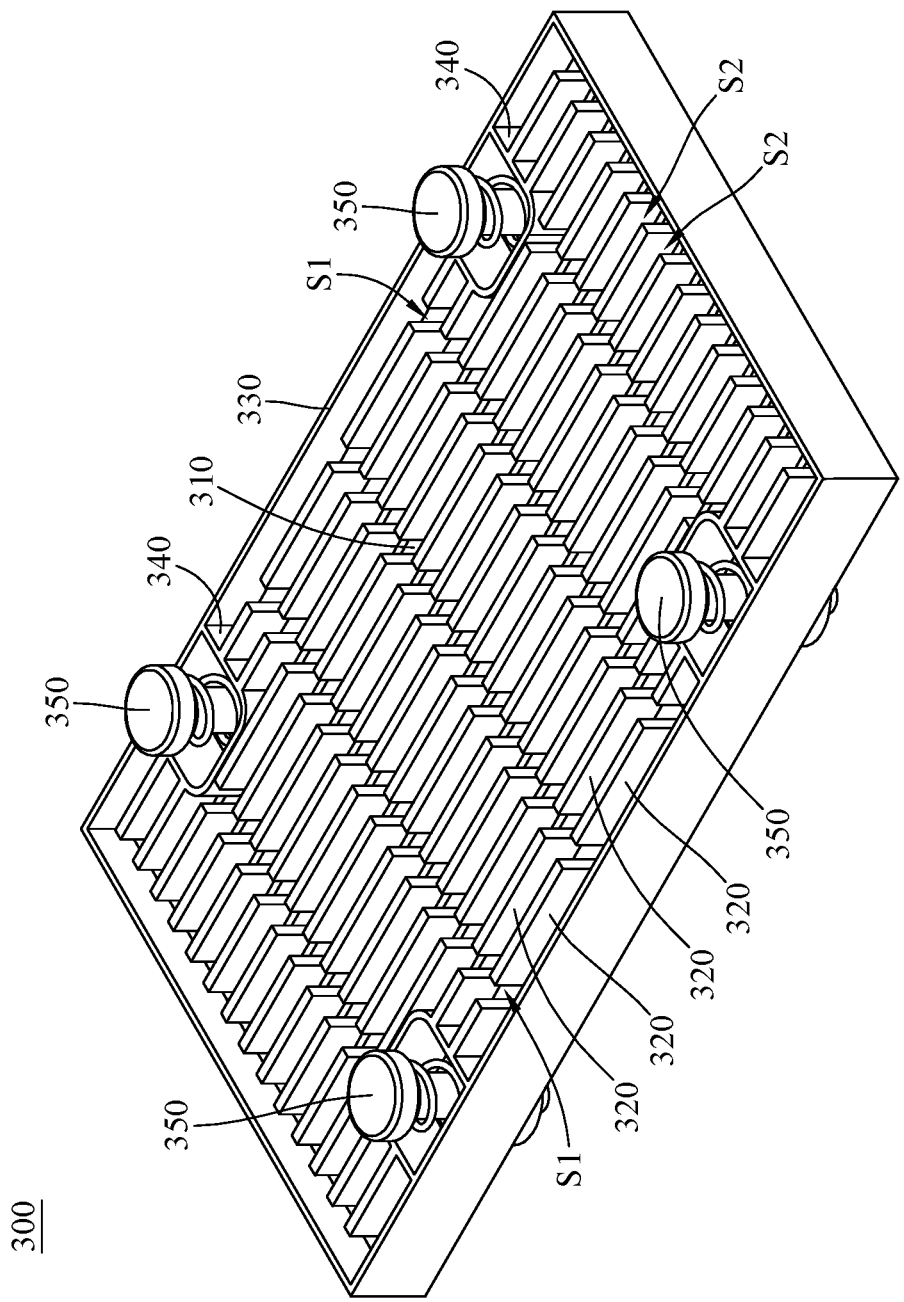
FIG. 2 is a perspective view of a heat sink of the electronic device in FIG. 1.
Figure 3:
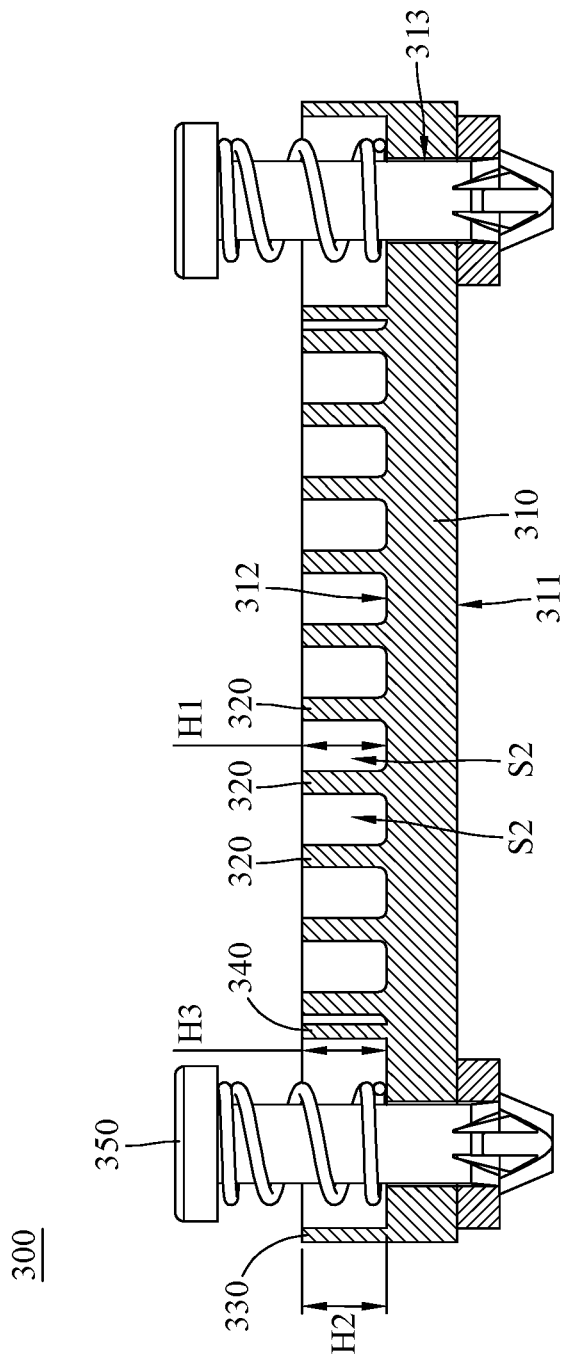
FIG. 3 is a cross-sectional view of the heat sink in FIG. 2.

Referring to FIGS. 1 to 3, there are shown an electronic device 10 according to a first embodiment of the invention, a perspective view of a heat sink 300 of the electronic device 10 in FIG. 1, and a cross-sectional view of the heat sink 300 in FIG. 2.

In this embodiment, the electronic device 10 is, for example, a server, and a coolant 20 is provided to drop on to the electronic device 10 to cool the electronic device 10. As shown, the electronic device 10 includes a casing 100, an electronic assembly 200, a heat sink 300, and a cover 400.

The casing 100 includes an accommodation space 110. The electronic assembly 200 is located in the accommodation space 110. The electronic assembly 200 includes a circuit board 210 and a heat source 220. The circuit board 210 is, for example, a motherboard. The circuit board 210 is mounted on the casing 100. The heat source 220 is, for example, a central processing unit (CPU). The heat source 220 is mounted on the circuit board 210. The heat sink 300 is located in the accommodation space 110, and is mounted on and thermally in contact with the circuit board 210 to absorb heat generated by the heat source 220.

The heat sink 300 was made using, for example, aluminum extrusion process. The heat sink 300 includes a base portion 310, a plurality of fin portions 320, and a wall portion 330. The base portion 310 includes a thermal contact surface 311 and a rear surface 312. The thermal contact surface 311 is thermally in contact with the heat source 220. The rear surface 312 faces away from the thermal contact surface 311. The fin portions 320 protrude from the rear surface 312 of the base portion 310. The wall portion 330 protrudes from the rear surface 312 of the base portion 310 and surrounds the fin portions 320. The wall portion 330 is configured to retain the coolant 20 dropped on the heat sink 300 so as to increase the time of heat exchange between the coolant 20 and the fin portions 320.

In this embodiment, the height H2 of the wall portion 330 protruding from the rear surface 312 is substantially equal to the height H1 of each fin portion 320 protruding from the rear surface 312, such that the heat sink 300 is able to contain a volume of the coolant 20 having a depth up to the height of the fin portions 320, thereby ensuring the heat exchange effect between the fin portions 320 and the coolant 20. However, the heights of the wall portions 330 are not restricted to be equal to that of the fin portions 320; in some other embodiments, the wall portions may be shorter or taller than the fin portions.

In this embodiment, the fin portions 320 are spaced apart from each other and spaced apart from the wall portion 330. As shown, the fin portions 320 are arranged in plural rows separated from each other and the fin portions 320 in each row are spaced apart from each other so that the fin portions 320 form a plurality of longitudinal channels S1 and a plurality of transverse channels S2 intersecting each other in the wall portion 330. The longitudinal channels S1 and the transverse channels S2 allow the coolant 20 to be evenly distributed to all fin portions 320, ensuring the heat exchange effect on each fin portion 320. Note that the arrangement of the fin portions 320 can be modified according to actual requirements and is not intended to limit the invention. Other exemplary arrangements of the fin portions will be described in later paragraphs.

In this embodiment, the electronic device 10 further may include a plurality of fasteners 350. The fasteners 350 are, for example, engagement pins. The heat sink 300 is mounted on the circuit board 210 via, for example, the fasteners 350. In detail, the base portion 310 may further include a plurality of mount holes 313. The mount holes 313 penetrate through the thermal contact surface 311 and the rear surface 312. The fasteners 350 are respectively disposed through the mount holes 313 and engaged with the circuit board 210.

In this embodiment, the heat sink 300 may further include a plurality of partition portions 340. The partition portions 340 protrude from the rear surface 312 and are respectively connected to different sides of the wall portion 330, and the partition portions 340 and the wall portion 330 respectively surround the mount holes 313 so as to prevent the coolant 20 from flowing into the mount holes 313. The height H3 of each partition portion 340 protruding from the rear surface 312 is substantially equal to both the height H1 of each fin portion 320 and the height H2 of the wall portion 330 protruding from the rear surface 312, such that the heat sink 300 is able to contain a volume of the coolant 20 having a depth up to the heights H1 of the fin portions 320, thereby ensuring the heat exchange effect between the fin portions 320 and the coolant 20. However, the heights of the partition portions are not restricted to be equal to that of the fin portions 320; in some other embodiments, the partition portions may be shorter or taller than the fin portions.

The cover 400 is mounted on the casing 100, and includes a plurality of through holes 410. The through holes 410 connect the accommodation space 110 to the outside. The through holes 410 are configured for the passage of the coolant 20 to drop on the heat sink 300.

In this embodiment, the cover 400 is directly mounted on the casing 100, but the present invention is not limited thereto; in some other embodiments, the cover may be disposed above the casing via a proper mount.

Figure 4:
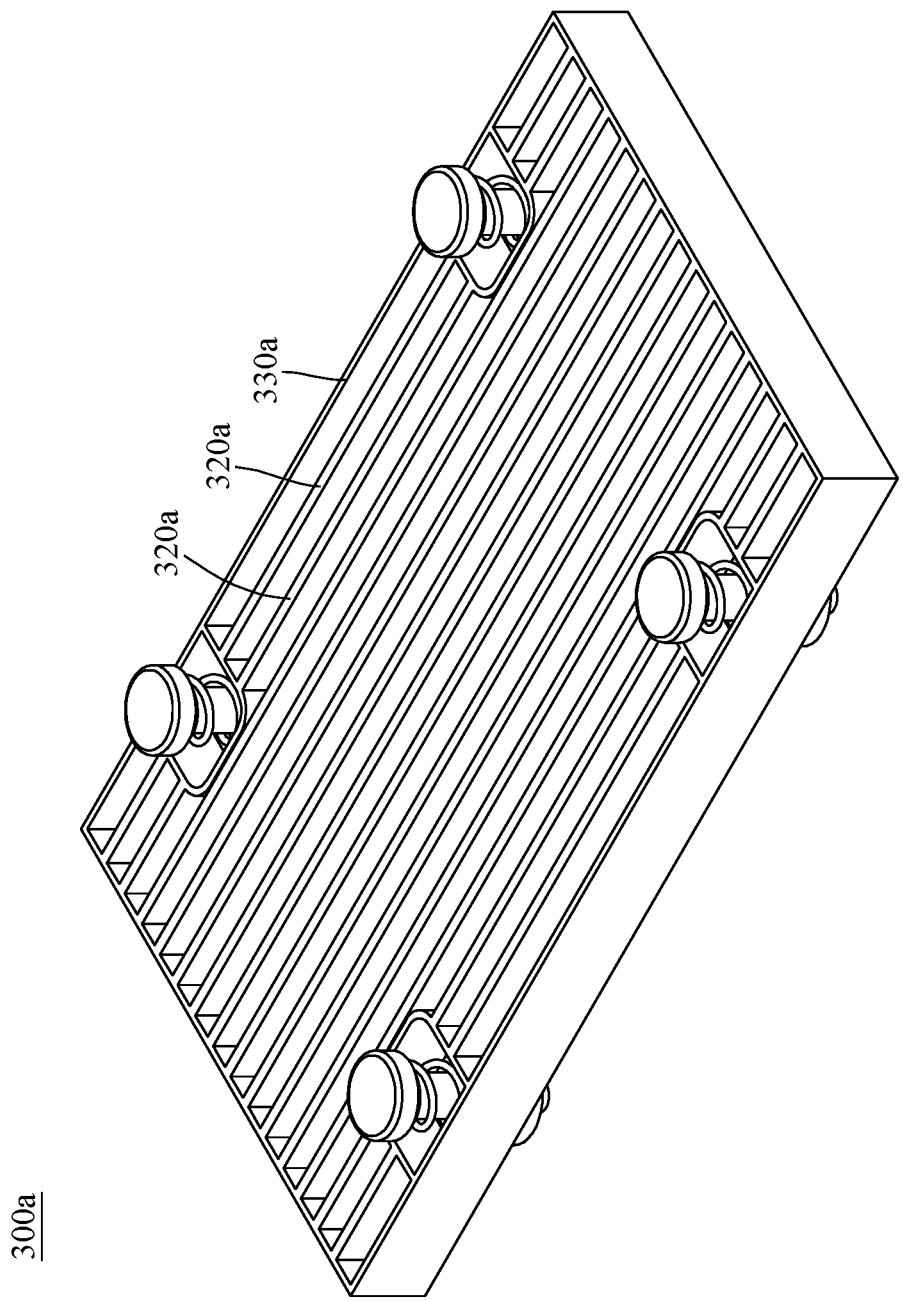
FIG. 4 is a perspective view of a heat sink according to a second embodiment of the invention.

In the previous embodiment, the fin portions 320 of the heat sink 300 are spaced apart from the wall portion 330, but the present invention is not limited thereto. Referring to FIG. 4, there is shown a perspective view of a heat sink 300a according to a second embodiment of the invention. In FIG. 4, fin portions 320a of the heat sink 300a are arranged side by side and each of the fin portions 320 extends from one side of the wall portion 330a of the heat sink 300a to the other; specifically, two opposite ends of each fin portion 320a are directly connected to two opposite sides of the wall portion 330a. The fin portions 320a and the wall portion 330a together from a plurality of channels extending in the same direction. In this embodiment, the channels extend in a longitudinal direction (e.g., similar to the longitudinal channels S1 shown in FIG. 1), but the present invention is not limited thereto; in some other embodiment, the channels may be extend in a transverse direction (e.g., similar to the transverse channels S2 shown in FIG. 2).

According to the electronic device and the heat sinks, the wall portion surrounds the fin portions, such that the wall portion can retain the coolant on the heat sink so as to increase the time of heat exchange between the coolant and the fin portions.

In addition, the height of the wall portion protruding is equal to the heights of the fin portions, such that the heat sink can retain a volume of the coolant having a depth up to the heights of the fin portions, thereby ensuring the heat exchange effect between the fin portions and the coolant.

Furthermore, the fin portions are spaced apart from the wall portion, the fin portions are arranged in plural rows separated from each other, and the fin portions in each row are spaced apart from each other so that the fin portions form the longitudinal channels and the transverse channels intersecting each other. Therefore, the coolant is allowed to be evenly distributed to all fin portions, thereby ensuring the heat exchange effect on each fin portion.

Moreover, the partition portions and the wall portion respectively surround the mount holes so as to prevent the coolant from flowing into the mount holes.

In one embodiment of the invention, the server can be adopted in the artificial intelligence computing or the edge computing. In addition, the server may be a 5G server, a cloud server or a vehicle network server.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A heat sink, configured to be in thermal contact with a heat source, the heat sink comprising:
    a base portion, comprising a thermal contact surface, a rear surface, and a plurality of mount holes, wherein the thermal contact surface is configured to be in thermal contact with the heat source, and the rear surface faces away from the thermal contact surface, the plurality of mount holes penetrate through the thermal contact surface and the rear surface;
    a plurality of fin portions, protruding from the rear surface of the base portion;
    a wall portion, protruding from the rear surface of the base portion and surrounding the plurality of fin portions; and
    a plurality of partition portions, wherein the plurality of partition portions protrude from the rear surface and are respectively connected to different sides of the wall portion, the plurality of partition portions and the wall portion respectively surround the plurality of mount holes.

2. The heat sink according to claim 1, wherein the plurality of fin portions are spaced apart from the wall portion.

3. The heat sink according to claim 1, wherein the plurality of fin portions are connected to the wall portion.

4. The heat sink according to claim 1, wherein the plurality of fin portions are arranged in plural rows separated from each other, and the plurality of fin portions in each row are spaced apart from each other so that the plurality of fin portions form a plurality of longitudinal channels and a plurality of transverse channels intersecting each other in the wall portion.

5. The heat sink according to claim 1, wherein a height of each of the plurality of partition portions protruding from the rear surface is substantially equal to a height of each of the plurality of fin portions protruding from the rear surface.

6. The heat sink according to claim 1, wherein a height of the wall portion protruding from the rear surface is substantially equal to a height of each of the plurality of fin portions protruding from the rear surface.

7. An electronic device, comprising:
    a casing, comprising an accommodation space;
    an electronic assembly, located in the accommodation space, wherein the electronic assembly comprises a circuit board and a heat source, the circuit board is mounted on the casing, and the heat source is mounted on the circuit board;
    a heat sink, located in the accommodation space, comprising:
        a base portion, comprising a thermal contact surface, a rear surface, and a plurality of mount holes, wherein the thermal contact surface is in thermal contact with the heat source, and the rear surface faces away from the thermal contact surface, the plurality of mount holes penetrate through the thermal contact surface and the rear surface;
        a plurality of fin portions, protruding from the rear surface of the base portion;
        a wall portion, protruding from the rear surface of the base portion and surrounding the plurality of fin portions; and
        a plurality of partition portions, wherein the plurality of partition portions protrude from the rear surface and are respectively connected to different sides of the wall portion, the plurality of partition portions and the wall portion respectively surround the plurality of mount holes; and
    a cover, comprising a plurality of through holes, wherein the plurality of through holes are configured for a passage of a coolant to drop on the heat sink.

8. The electronic device according to claim 7, wherein the plurality of fin portions are arranged in plural rows separated from each other, and the plurality of fin portions in each row are spaced apart from each other so that the plurality of fin portions form a plurality of longitudinal channels and a plurality of transverse channels intersecting each other in the wall portion.

* * * * *